United States Patent
Yoshinaga

(10) Patent No.: US 7,773,012 B2
(45) Date of Patent: Aug. 10, 2010

(54) A/D CONVERTER

(75) Inventor: Chikashi Yoshinaga, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 68 days.

(21) Appl. No.: 12/213,966

(22) Filed: Jun. 26, 2008

(65) Prior Publication Data

US 2009/0009373 A1    Jan. 8, 2009

(30) Foreign Application Priority Data

Jul. 3, 2007   (JP)   ............... 2007-174972

(51) Int. Cl.
  *H03M 1/10*   (2006.01)
(52) U.S. Cl. .............. 341/120; 341/117; 341/118; 341/119; 341/155
(58) Field of Classification Search ......... 341/117–120, 341/161, 155, 144, 165, 172
See application file for complete search history.

(56) References Cited

U.S. PATENT DOCUMENTS 5,184,131 A * 2/1993 Ikeda .................. 341/165
5,581,252 A * 12/1996 Thomas ................ 341/144
6,473,021 B1 * 10/2002 Somayajula et al. ......... 341/172
2006/0232461 A1 * 10/2006 Felder .................. 341/161

FOREIGN PATENT DOCUMENTS

JP    2000-49609    2/2000

* cited by examiner

*Primary Examiner*—Jean B Jeanglaude
(74) *Attorney, Agent, or Firm*—McGinn IP Law Group, PLLC

(57) ABSTRACT

To prevent the value of a successive approximation register, which should be holding the value of the comparison result, from changing due to noise or the like during the A/D conversion by a successive approximation A/D converter, a detection circuit is arranged on an arbitrary bit of a successive approximation register 5 to detect the change in the value of the bit. The detection circuit detects the change in the value during the period in which the successive approximation register should be holding the data, such as during the period other than the comparison time, and outputs an abnormal conversion detection signal.

12 Claims, 16 Drawing Sheets

A/D CONVERTER

BACKGROUND OF THE INVENTION

1. Field of the Invention

The present invention relates to an A/D converter that converts voltage data into digital voltage data, and particularly, to a successive approximation A/D converter.

2. Description of the Related Art

A/D converters are used for various electronic circuits and various applications. Along with the development of the electronic circuit technology in recent years, the processes of the electronic circuits in which the A/D converters are used are becoming increasingly complex, while the reliability expected for the A/D converters is also increasing. Especially in the A/D converters and the like used as on-vehicle electronic circuits, the reliability expected for the A/D converters needs to be increased.

FIG. 15 is a block diagram of a general successive approximation A/D converter. A successive approximation A/D converter 100 includes a timing control circuit 2, a sample-hold circuit 3 that samples and holds an analog input voltage Vin, a comparator 4 that compares the analog input voltage Vin held in the sample-hold circuit 3 and a reference voltage Vref, a successive approximation register 50 that generates comparison codes for determining a reference potential for the next comparison based on the comparison result of the comparator 4, and a D/A converter 6 that generates the reference voltage Vref based on the result of the successive approximation register 50. FIG. 15 illustrates a six-bit A/D converter. The comparison codes D5 to D0 provided for the D/A converter 6 serve as an A/D conversion result at the end of the A/D conversion.

In regard to such a successive approximation A/D converter, a successive approximation A/D converter is described in Japanese Patent Laid-Open No. 2000-049609 that can increase the reliability of the converted values even if an erroneous comparison and judgment is made during conversion due to external noise or the like. FIG. 16 is a schematic diagram modified the successive approximation A/D converter shown in Japanese Patent Laid-Open No. 2000-049609. It is to be noted that the same constituents as those shown FIG. 15 are denoted by the same reference numerals.

A potentially erroneous bit decision circuit 130 sequentially compares the value of the lowest bit of the successive approximation register 50, the value being the result of the A/D conversion of the analog input signal Vin, and the values of the subsequent higher bits. When the value of the higher bit has become different first from the value of the lowest bit, the bit is a potentially erroneous bit. A comparison decision circuit 140 judges whether the digit position of the potentially erroneous bit is below the digit position of the tolerable error bit set up in a tolerance setting register 160. If the digit position of the potentially erroneous bit is above the digit position of the tolerable error bit, the A/D conversion is determined to be erroneous, and a control signal for requesting reconversion is outputted to the control circuit 2 and the like.

However, the value of an arbitrary bit of the successive approximation register may be inverted due to external noise or software error. If the inverted bit is detected as a potentially erroneous bit, the A/D converter shown in FIG. 16 determines that the conversion result is erroneous and digitally converts the analog input signal Vin again. However, if the data is inverted after the comparison result is provided to the arbitrary bit of the successive approximation register, the A/D converter shown in FIG. 16 determines that the A/D conversion has been conducted normally and outputs a wrong conversion result unless the bit is detected as a potentially erroneous bit. Even if the bit is detected as a potentially erroneous bit and reconversion is performed, the potentially erroneous bit decision is made after the conversion result is set up to every bit of the successive approximation register. Therefore, it takes time to obtain the correct conversion result.

SUMMARY OF THE INVENTION

The present invention is provided with: a comparator that compares an analog input voltage and a reference voltage; a successive approximation register, formed of a plurality of bits, that stores the comparison result of the comparator and that generates comparison codes based on the comparison result; a D/A converter that generates a reference voltage for the next comparison based on the comparison codes; and a detection circuit that detects the change in the value of an arbitrary bit of the plurality of bits and that outputs an abnormal conversion detection signal.

According to the present invention, the detection of the change in the value of an arbitrary bit enables to detect abnormal operation of the successive approximation register. Therefore, abnormality in the A/D conversion can be appropriately detected, and immediate reconversion can also be performed. As a result, the time required for the A/D conversion process can be reduced while improving the reliability of the converted values.

According to the present invention, an abnormal operation of the successive approximation A/D converter, especially the successive approximation register, can be detected.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The preferred embodiments of the present invention will now be described with reference to the drawings.

First Embodiment

Figure 1:
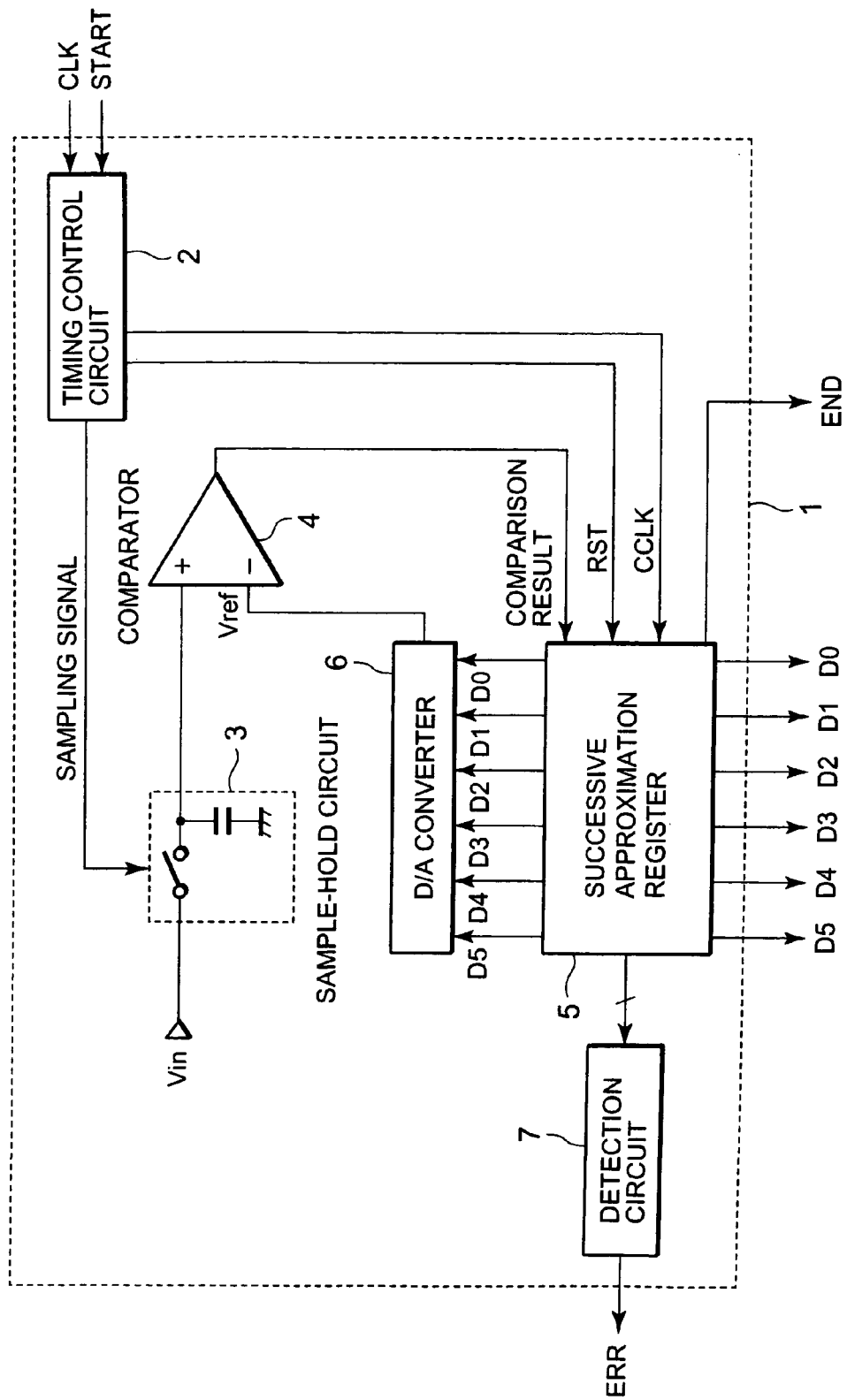
FIG. 1 is a schematic diagram illustrative of a successive approximation A/D converter according to a first embodiment of the present invention.
Figure 15:
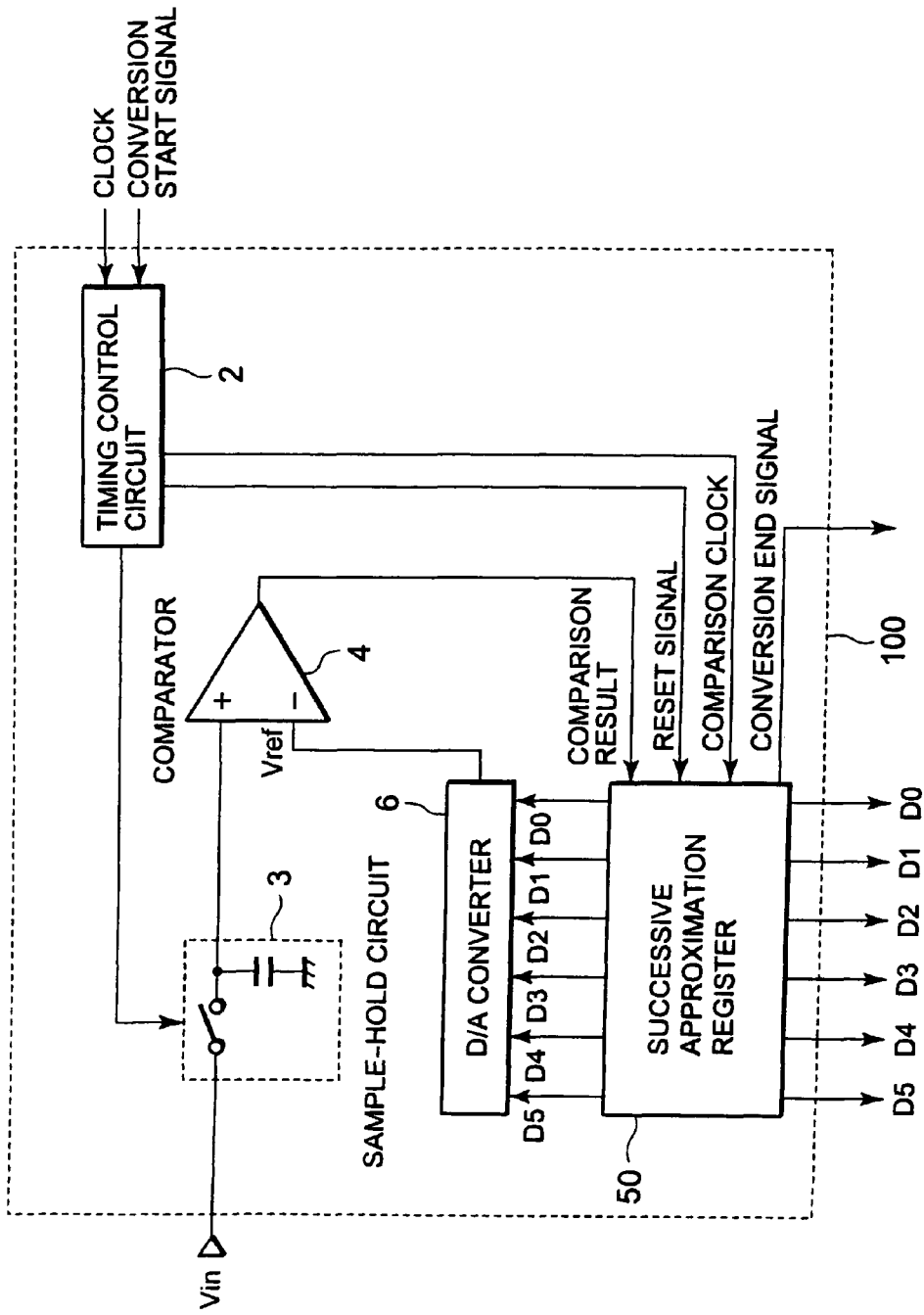
FIG. 15 is a schematic circuit diagram of a first successive approximation A/D converter of related art.
Figure 16:
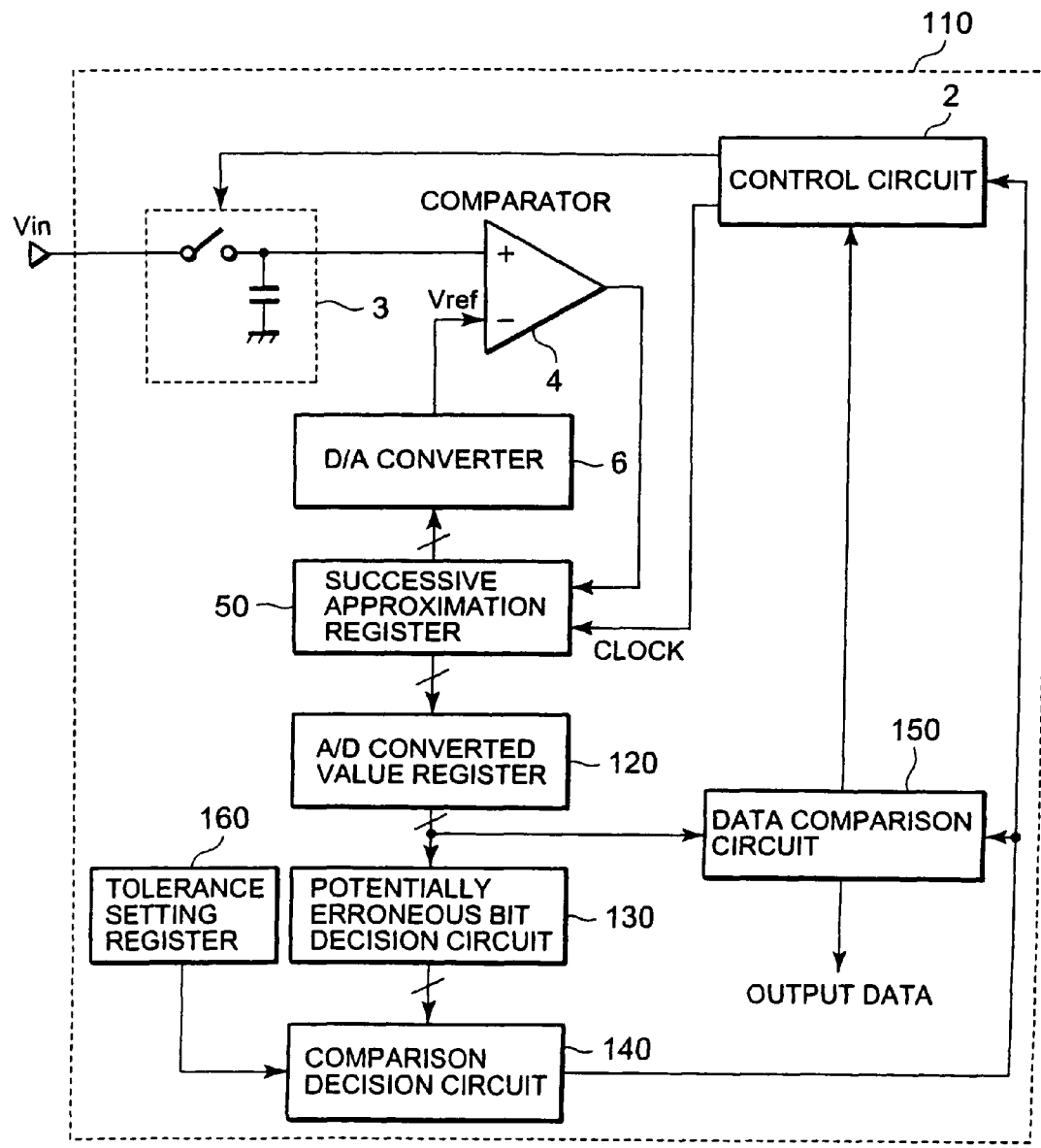
FIG. 16 is a schematic circuit diagram of a second successive approximation A/D converter of related art.

FIG. 1 is a schematic diagram of a first embodiment of the present invention. It is to be noted that the same constituents as those shown FIG. 15 are denoted by the same reference numerals and the further description thereon is omitted.

In this embodiment, a successive approximation A/D converter 1 includes a timing control circuit 2, a sample-hold circuit 3, a comparator 4, a successive approximation register 5, a D/A converter 6, and a detection circuit 7, and outputs an abnormal conversion detection signal. The A/D converter is not particularly limited, but an A/D converter in which the A/D conversion result is outputted in six bits will be described.

Figure 2:
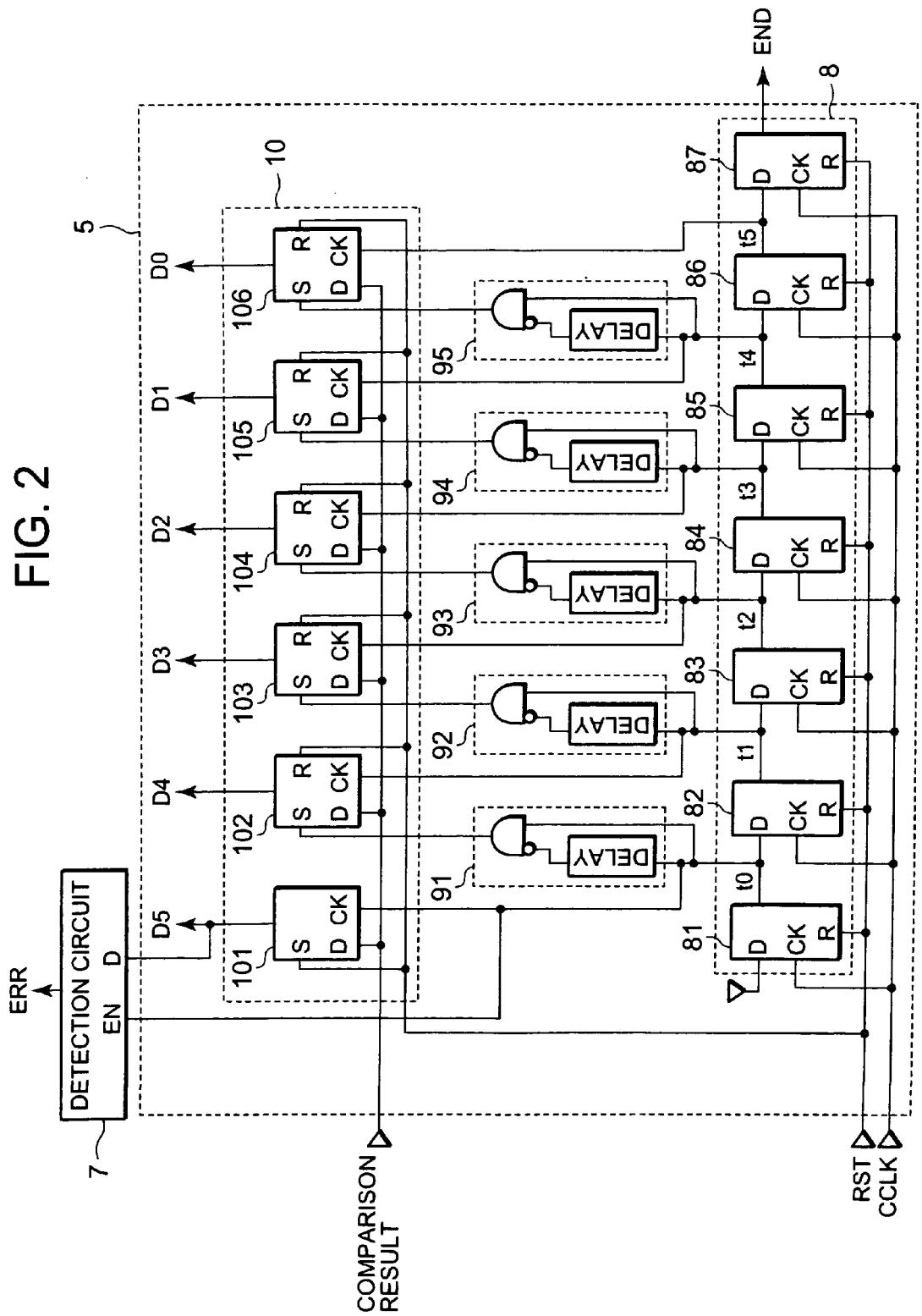
FIG. 2 is a circuit diagram illustrative of a successive approximation register and a detection circuit according to the first embodiment of the present invention.

The successive approximation register 5 will be described in detail with reference to FIG. 2. The successive approximation register 5 includes: a shift register 8; a register 10 that holds, in bits D5 to D0, the values of the comparison result in accordance with storage timing signals t0 to t5 which are outputs of the shift register 8; and logic circuits 91 to 95 that set up the register 10. The shift register 8 includes F/Fs 81 to 87 with reset. The timing control circuit 2 supplies a reset signal RST to a reset terminal R of each F/F with reset and supplies a comparison clock signal CCLK to a clock terminal CK of each F/Fs. The register 10 is constituted by an F/F 101 with set and F/Fs 102 to 106 with set/reset and holds the comparison result in accordance with the storage timing signals t0 to t5 that are outputs of the corresponding F/Fs 81 to 87 with reset. Each of logic circuits 91 to 95 corresponding to the bits sets up the register 10 in accordance with the outputs of the shift register 8.

The successive approximation register 5 further includes a detection circuit 7 that detects the change in the value of the highest bit D5 of the successive approximation register 5. The data of the highest bit D5 and the storage timing signal t0 are supplied to the detection circuit 7. The detection circuit 7 detects the change in the value of the highest bit D5 in a period defined based on the storage timing signal to.

Figure 3:
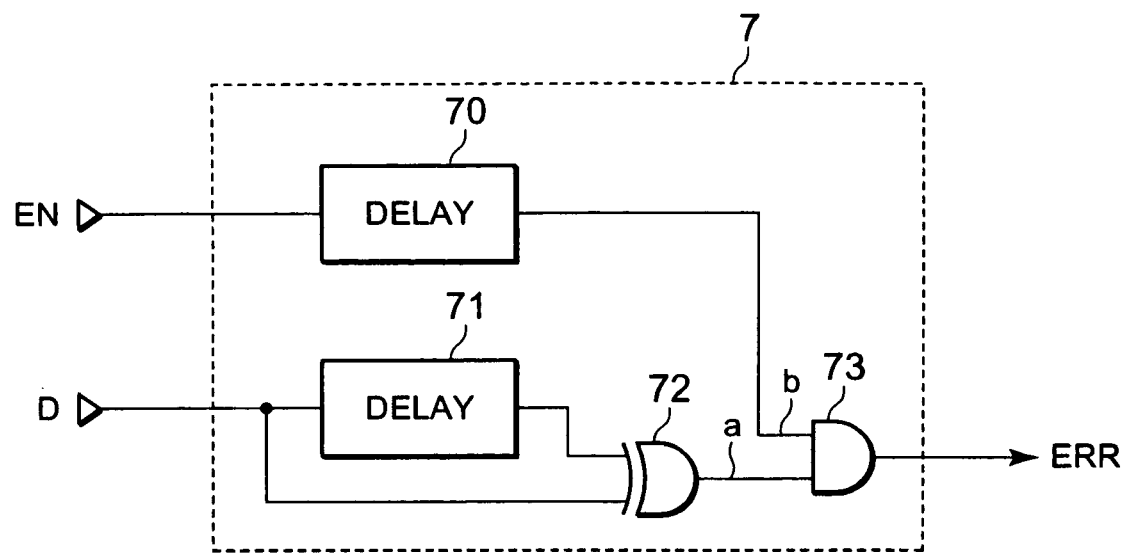
FIG. 3 is a circuit diagram illustrative of the detection circuit according to the first embodiment of the present invention.

FIG. 3 depicts a specific schematic circuit example of the detection circuit 7. The detection circuit 7 includes delay elements 70, 71, an EXOR circuit 72, and a NAND circuit 73. The EXOR circuit 72 outputs a change detection signal a that is indicative of the change in input signal D using the input D and a signal delayed by the delay element 71. The delay element 70 generates a signal, in which an input signal EN is delayed, and uses the delay signal as a detection permission signal b for permitting to output the change detection signal a. The input D is the highest bit D5 and the input signal EN is the timing signal to. Delays of the delay elements 70 and 71 will now be described. The value of the highest bit D5 changes when the F/F 101 with set latches the comparison result. However, this is a normal operation of the successive approximation register 6. Therefore, the detection circuit 7 needs to be designed not to detect the change in the highest bit D5 from this normal operation. Thus, the delay of the delay element 70 is made longer than the delay of the delay element 71 to mask the change detection signal, caused by the latching of the value of the comparison result, for a desired time. As a result, the detection circuit 7 can detect the change after a desired time has passed after the storage timing signal to is supplied, i.e., after the highest bit D5 is defined by the comparator.

As described, the feature that the value of the F/F in which the comparison result is set up in the successive approximation register is changed at the rising timing of the storage timing signal is utilized to distinguish the change from the change in the value of the F/F during normal A/D conversion. As a result, the change in the value of the F/F at timing in which the value should not be actually changed can be detected.

An operation of the successive approximation A/D converter of the present invention will now be described in detail with reference to FIG. 4. Reference character Tsmp denotes a sampling time, T1 denotes a time of a first comparison, T2 denotes a time of a second comparison, and following comparisons are denoted with T3, T4, T5, and T6.

When a conversion start signal START is supplied, a reset signal RST is set to an "H" level as an active level accordingly, and the F/F 101 with reset is set. The F/F 101 outputs "H" level as initial value. The EXOR circuit 72 of the detection circuit 7 detects the change of bit D5, and the change detection signal a is set to the "H" level. However, the change in the output of the F/F 101 is a normal operation of the successive approximation A/D converter. In this case, the detection permission signal b is set to the "L" level because the storage timing signal t0 is in the "L" level. As a result, the change of bit D5 is never detected as abnormal conversion. The sample-hold circuit 3 receives a sampling signal SMP in accordance with the conversion start signal START. The sample-hold circuit 3 holds an analog input voltage Vin within the period of time Tsmp in accordance with the sampling signal SMP.

After the sampling operation, a first comparison operation is started. The comparator 4 compares the sampled analog input voltage Vin and the reference voltage Vref, which is outputted from the D/A converter 6 based on "100000" that is the initial value of the successive approximation register. The F/F 81 outputs the storage timing signal t0 in response to a comparison clock CCLK. The F/F 101 lathes "L" level as the first conversion result in the first comparison operation in response to the storage timing signal t0. The highest bit D5 changes from the initial value "H" level to the "L" level. However, the change of the bit D5 at this timing is a normal operation of the successive approximation A/D converter. Therefore, the detection permission signal b never detects the change as abnormal conversion even when the logic circuit 72 of the detection circuit 7 detects the change in the value.

When the first comparison operation is completed and the highest bit D5 of the successive approximation register as the first conversion result is determined, the value of the highest bit D5 should not be changed until the A/D conversion operation is completely finished. Therefore, when the value of the highest bit D5 is changed after the first comparison operation, it is determined that abnormal conversion is performed. Thus, the detection permission signal is set to the "H" level after the first comparison operation, and abnormal conversion will be detected.

In the second comparison operation, the bit D4 is set, and the reference voltage Vref shown as "010000" based on the first conversion result and the analog input Vin are compared. The second comparison result is then latched to the F/F 102 in accordance with the shift register 8. After that, comparison operations are sequentially repeated.

Figure 4:
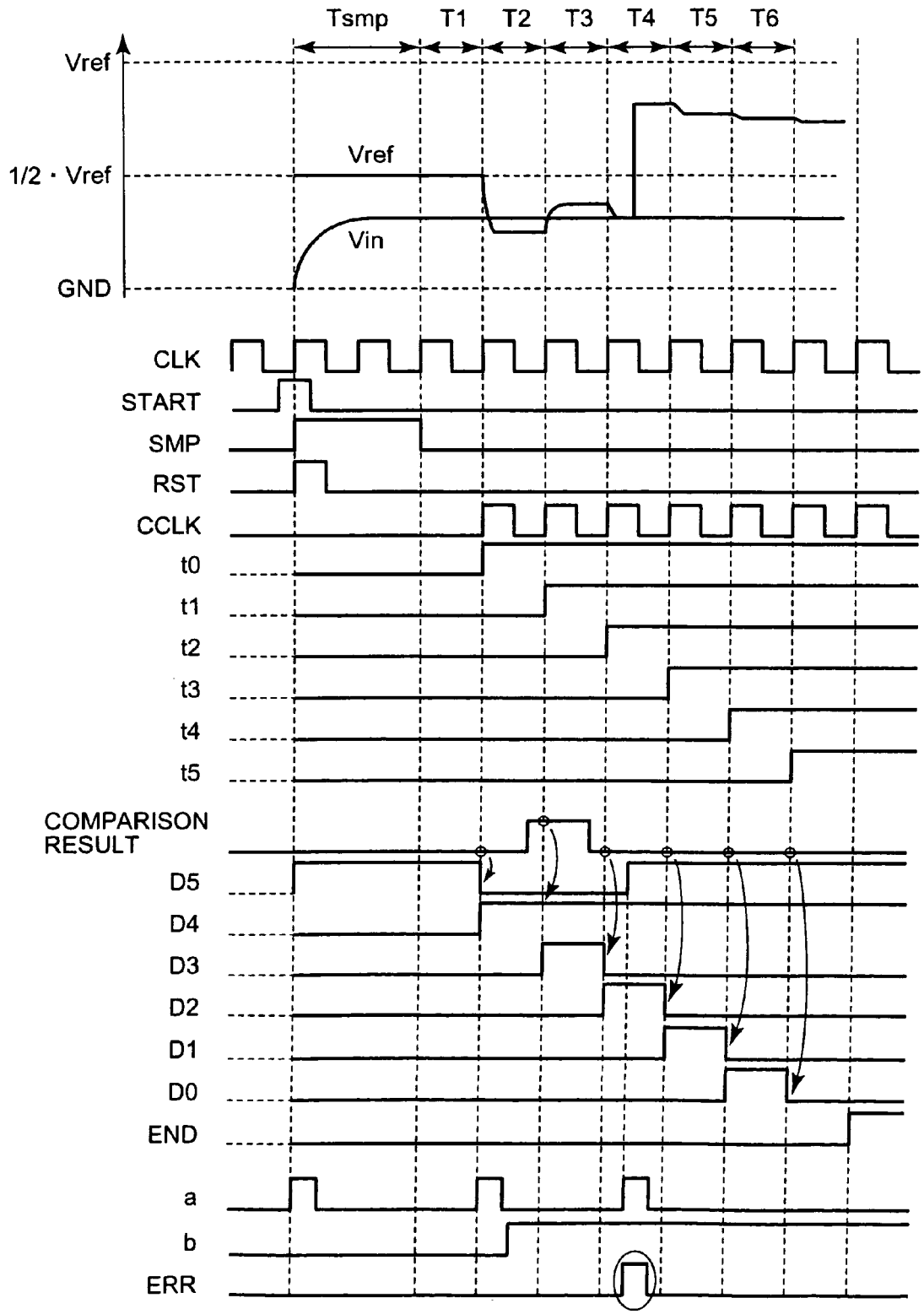
FIG. 4 is a timing diagram of the respective signals in the successive approximation A/D converter shown in FIG. 1.

In FIG. 4, the highest bit D5 latched in the F/F 101 is changed from the "L" level to the "H" level during a fourth comparison time T4 due to external factors such as software error and noise. If the value is changed after the comparison result is latched, a wrong A/D converted value is outputted in consequence. For example, in FIG. 4, although an A/D converted value "010100" is supposed to be obtained, a wrong A/D converted value "110000" is instead obtained as the value is changed after the F/F 101 has latched the comparison result. However, the detection circuit 7 detects the change of the highest bit D5. Therefore, the conversion can be determined as abnormal conversion. The detection permission signal b is set to the "H" level at this point, and thus, the change detection signal a is outputted as an abnormal conversion detection signal ERR. In this way, abnormal conversion can be detected when the highest, bit D5 is changed. Therefore, the abnormal conversion detection signal ERR can be used to abandon the A/D conversion result or to perform the A/D conversion again. As a result, the time required for the conversion can be reduced, and the reliability of the converted value can be improved.

An object is to detect the change in the value during the period in which the successive approximation register should be holding the value. Therefore, the circuit configuration of the detection circuit 7 is not limited to FIGS. 2 and 3 as long as the object can be realized.

Second Embodiment

Figure 5:
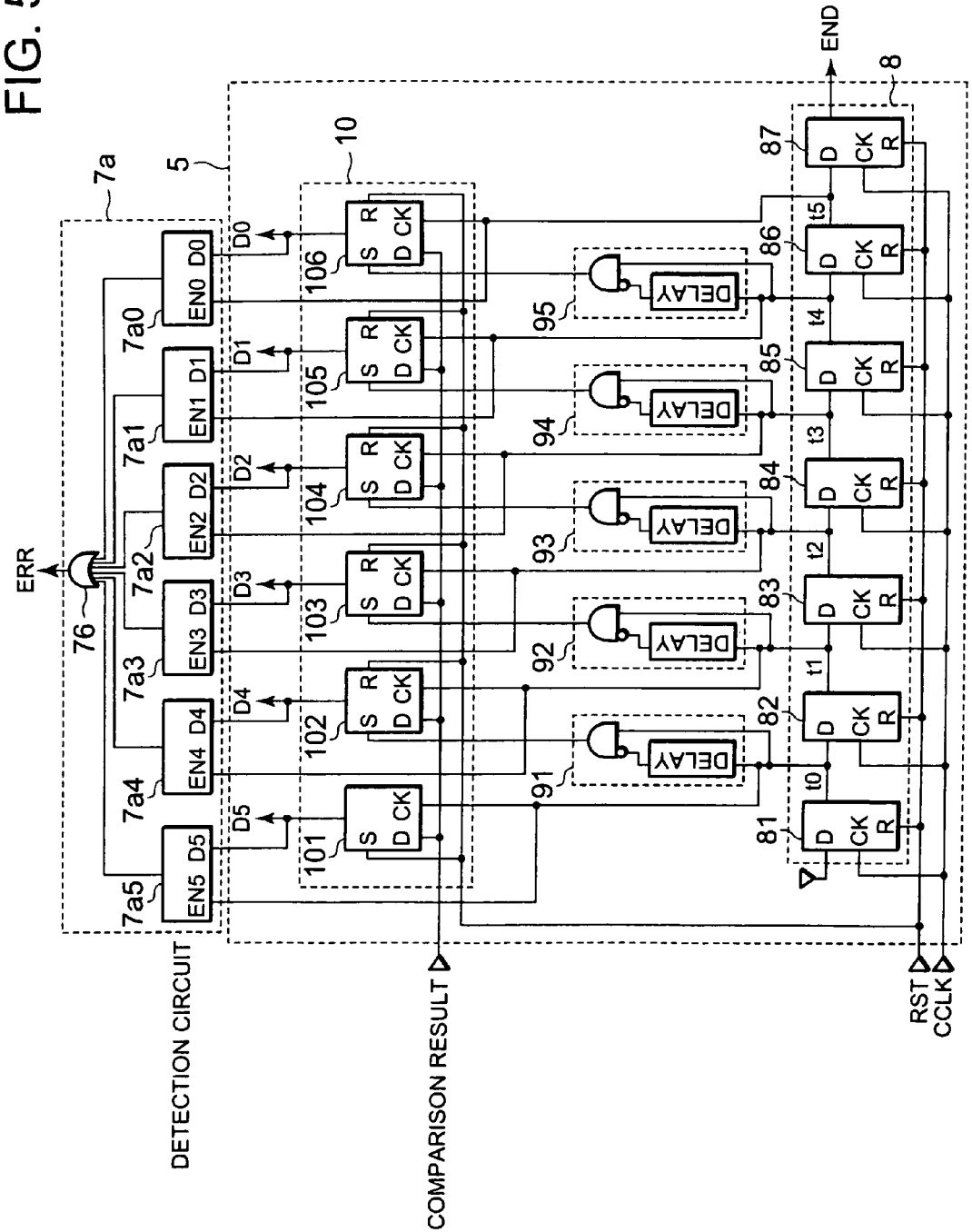
FIG. 5 is a circuit diagram illustrative of the successive approximation register and detection circuits according a second embodiment of the present invention.

FIG. 5 is a schematic diagram of a second embodiment of the present invention. The successive approximation register shown in FIG. 2 can detect only the abnormal change of the highest bit (D5). The successive approximation register shown in FIG. 5 further includes detection circuits 7a0, 7a1, 7a2, 7a3, 7a4, 7a5, and an OR circuit 76 to detect abnormal changes of a plurality of bits (all bits here).

The circuit configurations of the detection circuits 7a0, 7a1, 7a2, 7a3, 7a4, and 7a5 are the same as the circuit configuration of the detection circuit 7 shown in FIG. 3 and will not be described. The data D5 to D0 of the corresponding bits and the storage timing signals t0 to t5 that are outputs of the corresponding shift registers are supplied to the detection circuits 7a0 to 7a5, respectively. An abnormal conversion detection signal is outputted when any of the detection circuits 7a0 to 7a5 detects a change in the value of the data. As a result, an abnormal change of the bits can be detected, and the reliability of the converted value can be further improved in consequence.

Although all bits are detected for an abnormal change in FIG. 5, only necessary bits may be detected for an abnormal change. For example, if lower bits (D0 and D1) have abnormally changed but the change is determined to be within a margin of error, the detection circuits can be arranged on bits except the lower bits (D0 and D1). This enables to reduce the number of circuits.

Third Embodiment

Figure 6:
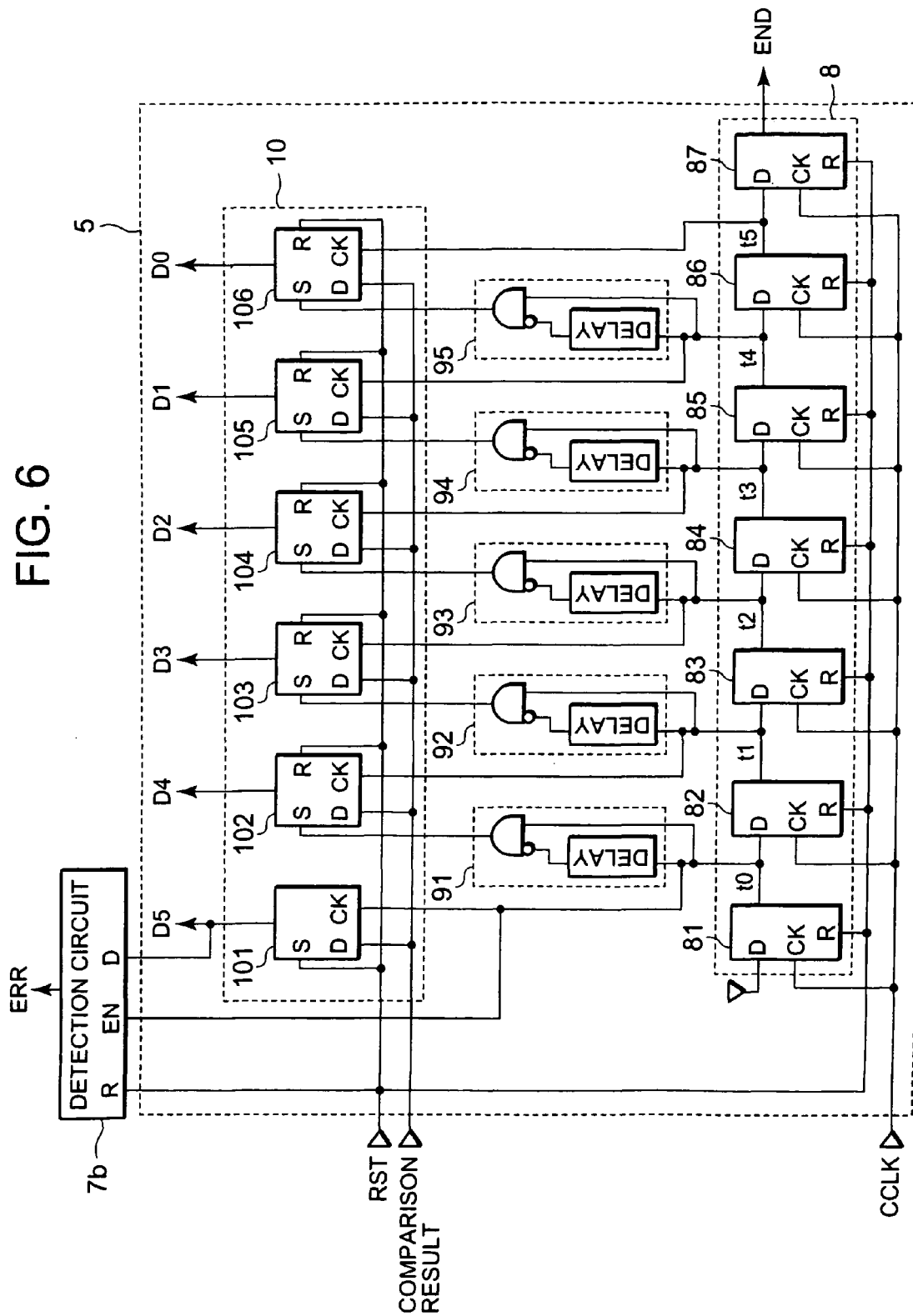
FIG. 6 is a circuit diagram illustrative of the successive approximation register and a detection circuit according to a third embodiment of the present invention.

FIG. 6 is a schematic diagram of a third embodiment of the present invention. The circuit configuration of the detection circuit 7 is different from that of the successive approximation register shown in FIG. 2. Other configurations are the same as in the first embodiment.

In the first embodiment, the detection circuit 7 is designed not to detect the change in the value at the timing in which the value of the comparison result is latched. However, in general, the first comparison operation is performed, with the value of the successive approximation register set up at the start of the A/D conversion serving as the initial value. Therefore, it is undesirable that the value of the highest bit D5 changes during the sampling operation. In other words, it is more preferable that the change in the value of the highest bit D5 during sampling operation is detected as an abnormal change.

Figure 7:
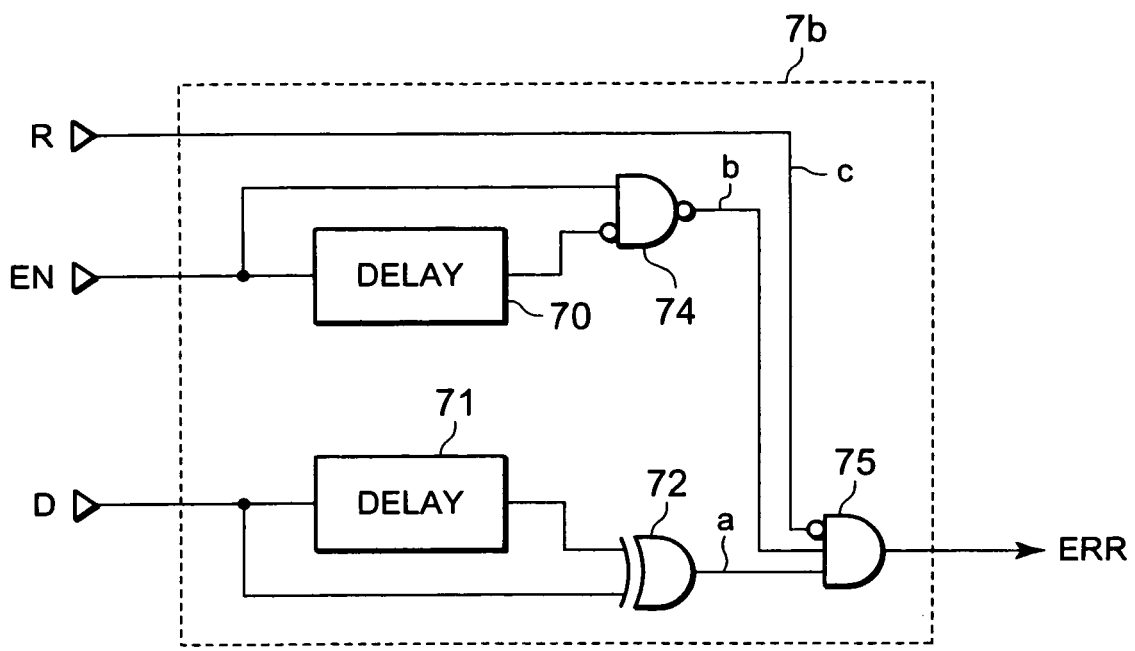
FIG. 7 is a circuit diagram illustrative of the detection circuit according to the third embodiment of the present invention.

Thus, as shown in FIG. 7, a detection circuit 7b is provided to which the highest bit D5, the output of the shift register, as well as the reset signal RST are supplied. The detection circuit 7b is constituted by the delay elements 70, 71, the EXOR circuit 72, a NAND circuit 74, and an AND circuit 75. The configurations of the delay element 71 and the EXOR circuit 72 are the same as in FIG. 3 and will not be described. The NAND circuit 74 refers to the logic of an input signal EN and a signal, in which the input signal EN is delayed, to thereby function as a mask signal that prevents the change of the input signal D from being detected as an abnormal change for a length of delay time of the delay element. Therefore, the detection circuit 7b does not output the change of the input signal D as an abnormal conversion detection signal during the period in which the signal R is in the "H" level and during the period defined by the output b of the NAND circuit 74. In this case, the reset signal RST is inputted to the input R, the storage timing signal t0 is inputted to the input EN, and the highest bit D5 is inputted to the input D. As a result, the detection circuit 7b does not detect the change in the data of the successive approximation register during the period from when the reset signal RST is supplied to when the initial value data is defined in the successive approximation register, and during the period until the comparison result is determined.

Figure 8:
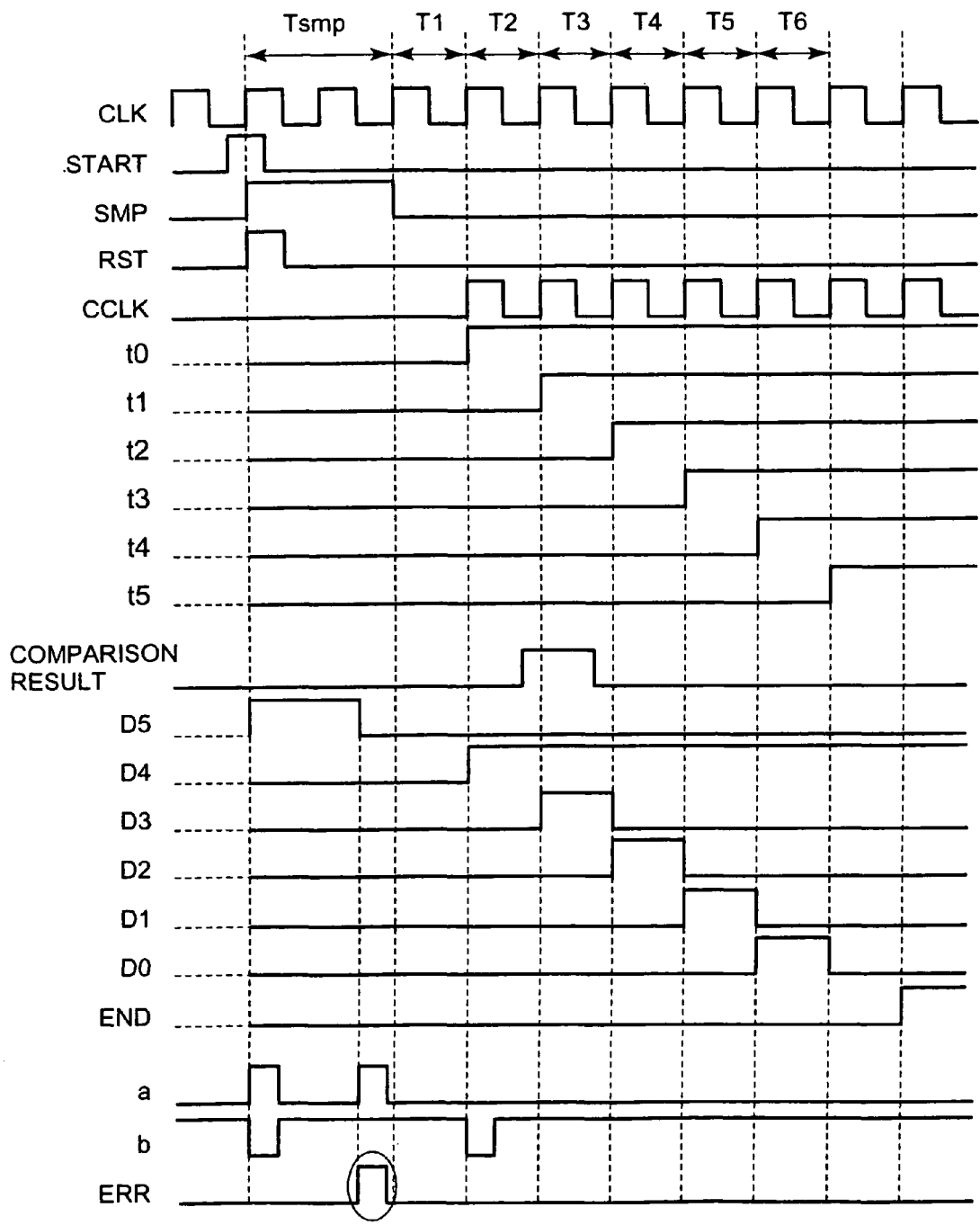
FIG. 8 is a timing diagram of the respective signals in the successive approximation register and the detection circuit shown in FIG. 6.

An operation of the successive approximation register according to the third embodiment of the present invention will now be described with reference to FIG. 8.

When the conversion start signal START is supplied, the reset signal RST is set to the "H" level accordingly. The F/F 101 with set is set to the "H" level in accordance with the reset signal RST. The EXOR circuit 72 of the detection circuit 7b detects this change, and the change detection signal is set to the "H" level. However, the change of the highest bit D5 at this timing is not detected as an abnormal change, because the reset signal RST is supplied to the AND circuit 75. In this way, the change of the highest bit D5 during reset can be distinguished from an abnormal change since the change is a normal operation of the successive approximation register.

The successive approximation register 5 then performs a sampling operation. If the data of the F/F 101 changes during the sampling time Tsmp due to software error or noise, the abnormal conversion detection signal ERR is outputted in accordance with the fact that the change detection signal a, which is an output of the EXOR circuit 72, has been set to the "H" level, because the AND circuit 75 is in the detection permission state.

Not only can the change of the highest bit D5 after the successive approximation register has latched the comparison result be detected, but also the abnormal conversion during the period after the initial value data is stored in the successive approximation register until the comparison result of the reference voltage and the input voltage based on the initial value data is stored in the successive approximation register can be detected. As a result, the abnormal conversion can be detected promptly, and the reliability can be further improved.

Fourth Embodiment

Figure 9:
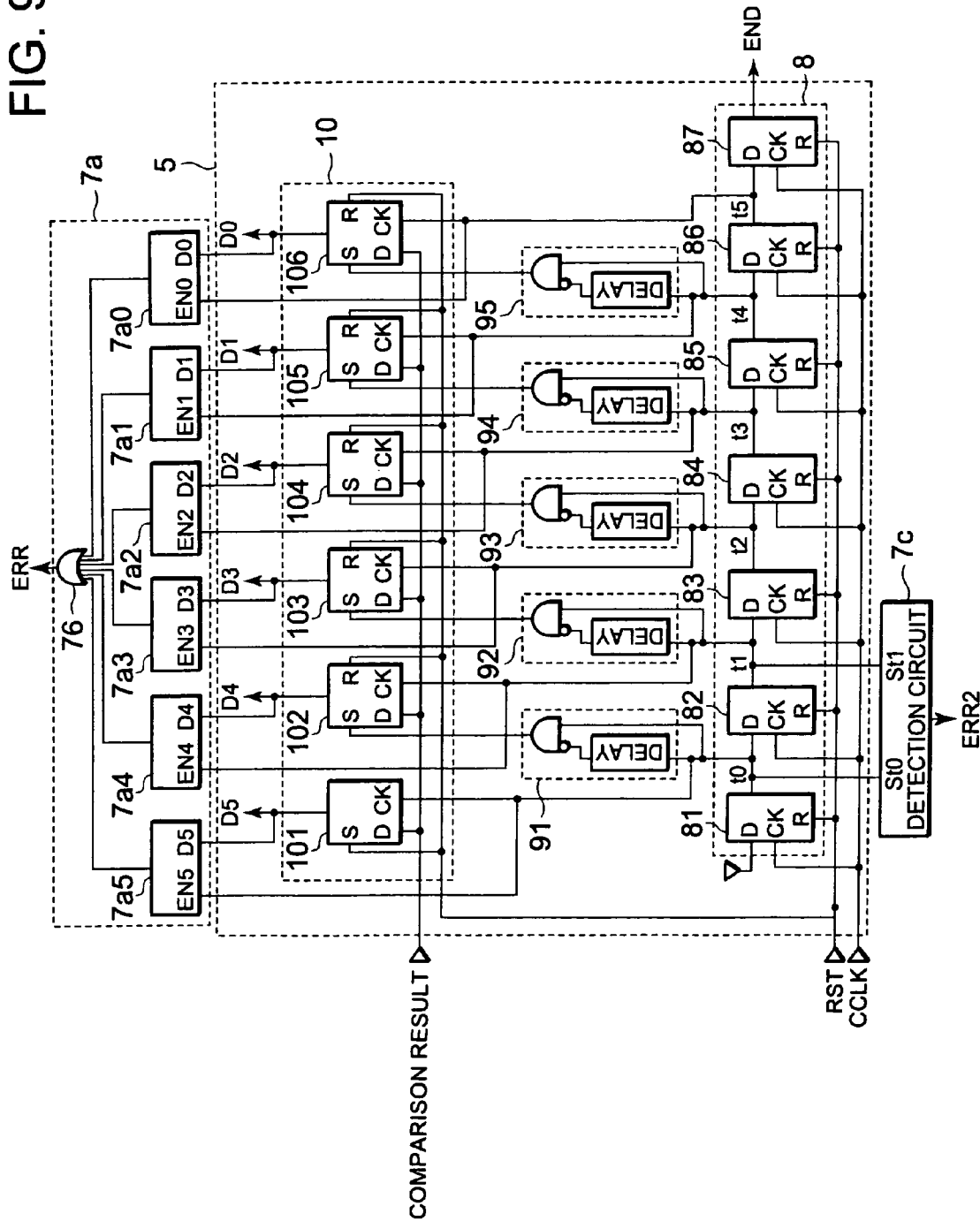
FIG. 9 is a circuit diagram illustrative of the successive approximation register and a detection circuit according to a fourth embodiment of the present invention.

FIG. 9 is a schematic diagram of a fourth embodiment of the present invention. Instead of the detection circuit 7 shown in FIG. 5, a detection circuit 7c is provided in FIG. 9 to detect abnormality of the shift register.

The first to third embodiments have enabled to detect the change in the value of the register that latches the comparison result. However, the F/Fs 81 to 87 with reset that constitute the shift register 8 may be affected by software error or noise. As the outputs of the shift register 8 sequentially change to the "H" level in accordance with the comparison clock CCLK, the successive approximation register 5 latches the comparison result in sequence and then generates the following comparison codes. However, if the values of the F/Fs 81 to 87 are changed from the "L" level to the "H" level at timing other than the predetermined timing due to software error or noise, the comparison result is stored in a wrong bit. As a result, the correct conversion result cannot be obtained.

Consequently, a detection circuit 7c is installed to detect abnormality when the outputs of the shift register 8 do not exhibit the "H" level in order. In other words, the detection circuit 7c detects whether the comparison result is stored from the higher bits to the lower bits in order.

Figure 10:
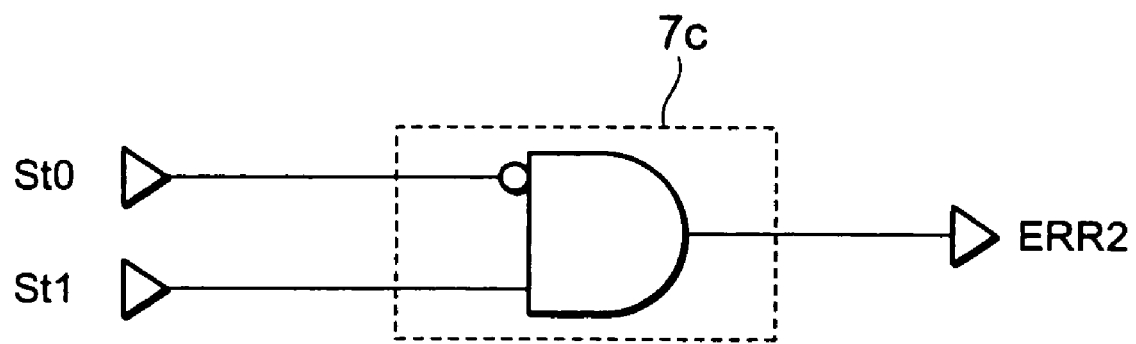
FIG. 10 is a circuit diagram illustrative of the detection circuit according to the fourth embodiment of the present invention.
Figure 11:
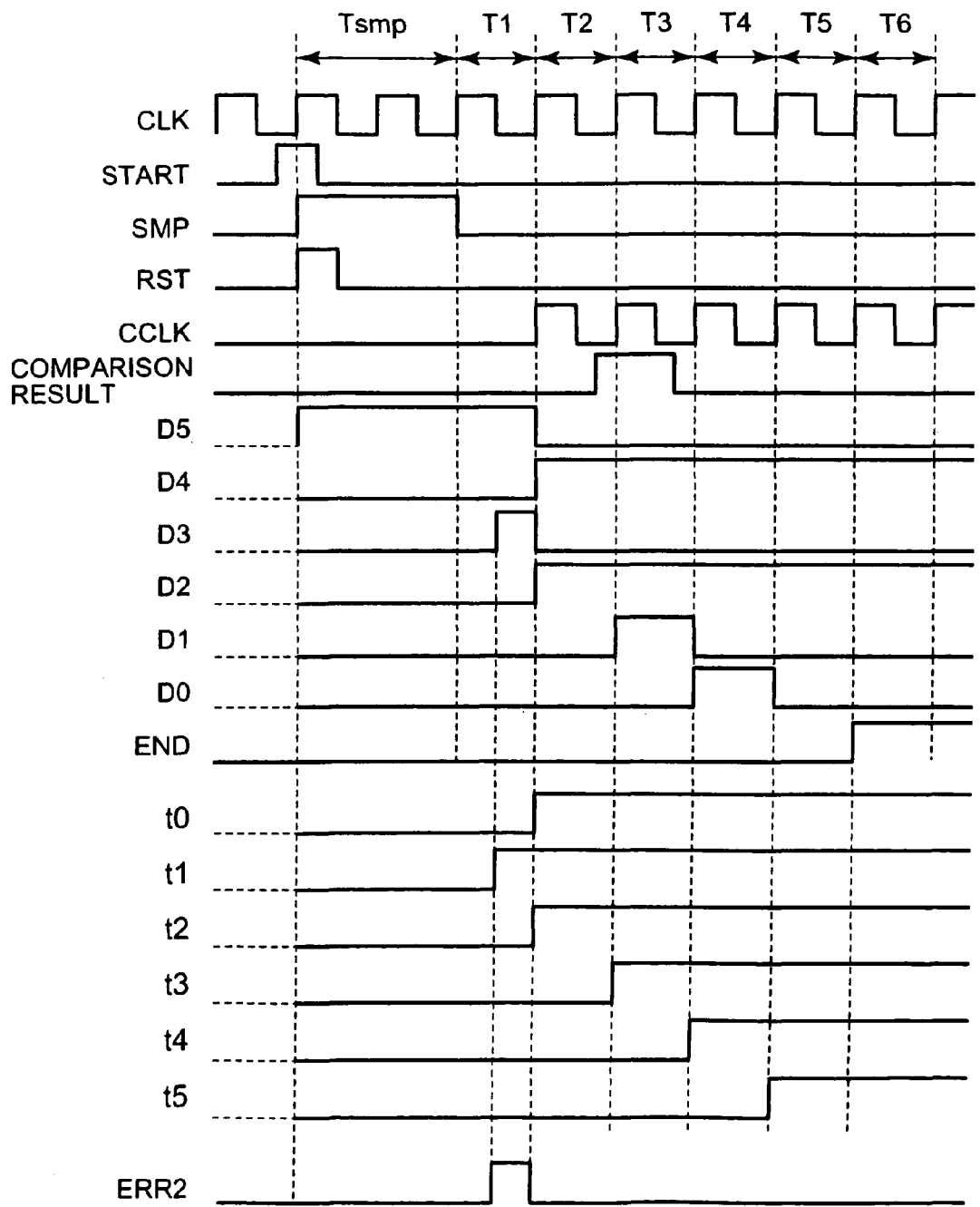
FIG. 11 is a timing diagram the respective signals in the successive approximation register and the detection circuit shown in FIG. 9.

FIG. 10 is a specific circuit configuration example of the detection circuit 7c. The detection circuit 7c is constituted by the AND circuit to which the storage timing signals t0 and t1, which are outputs of the shift register, are inputted. As shown in FIG. 4, the F/Fs 81 to 87 with reset that constitute the shift register 8 are initialized when the reset signal RST is supplied, and the outputs of the F/Fs are sequentially propagated to the "H" level in accordance with the comparison clock CCLK. The detection circuit 7c never detects abnormality if the storage timing signal t1 has not been set to the "H" level before the storage timing signal to. However, as shown in FIG. 11, if the F/F 82 is influenced by software error or noise and the data of the storage timing signal t1 corresponding to a lower bit is changed before the storage timing signal to corresponding to a higher bit (period of time T1), the detection circuit 7c determines that an abnormal operation is conducted and outputs the "H" level.

In this way, the detection of abnormal operation of the shift register enables to further improve the reliability of the A/D conversion result. In FIG. 9, the abnormal change in the storage timing signals t0 and t1 among others is detected as an example. However, an abnormal change can also be detected for other outputs of the shift register by installing a detection circuit with similar configuration.

Fifth Embodiment

Figure 12:
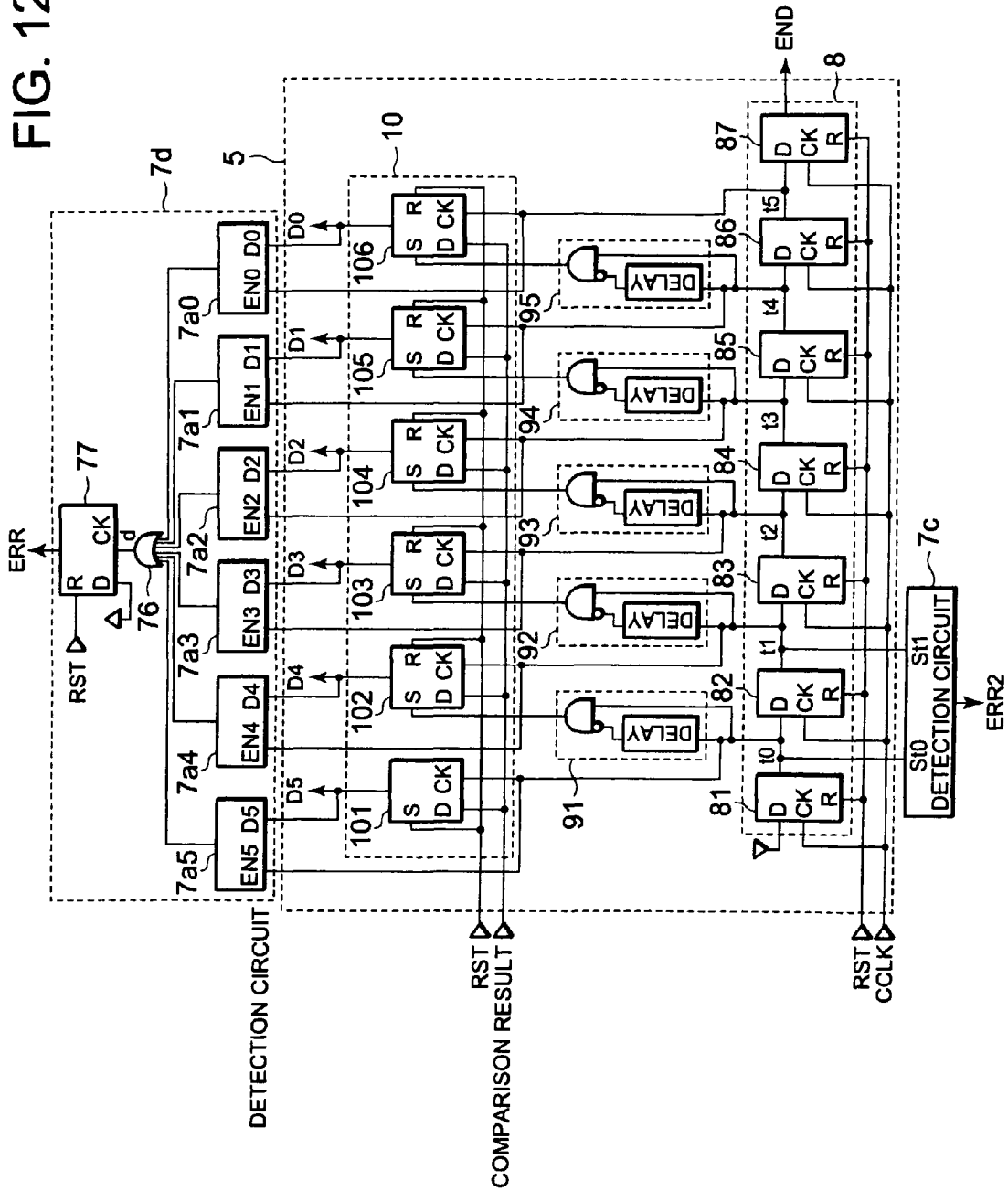
FIG. 12 is a circuit diagram of the successive approximation register and a detection circuit according to a fifth embodiment of the present invention.
Figure 13:
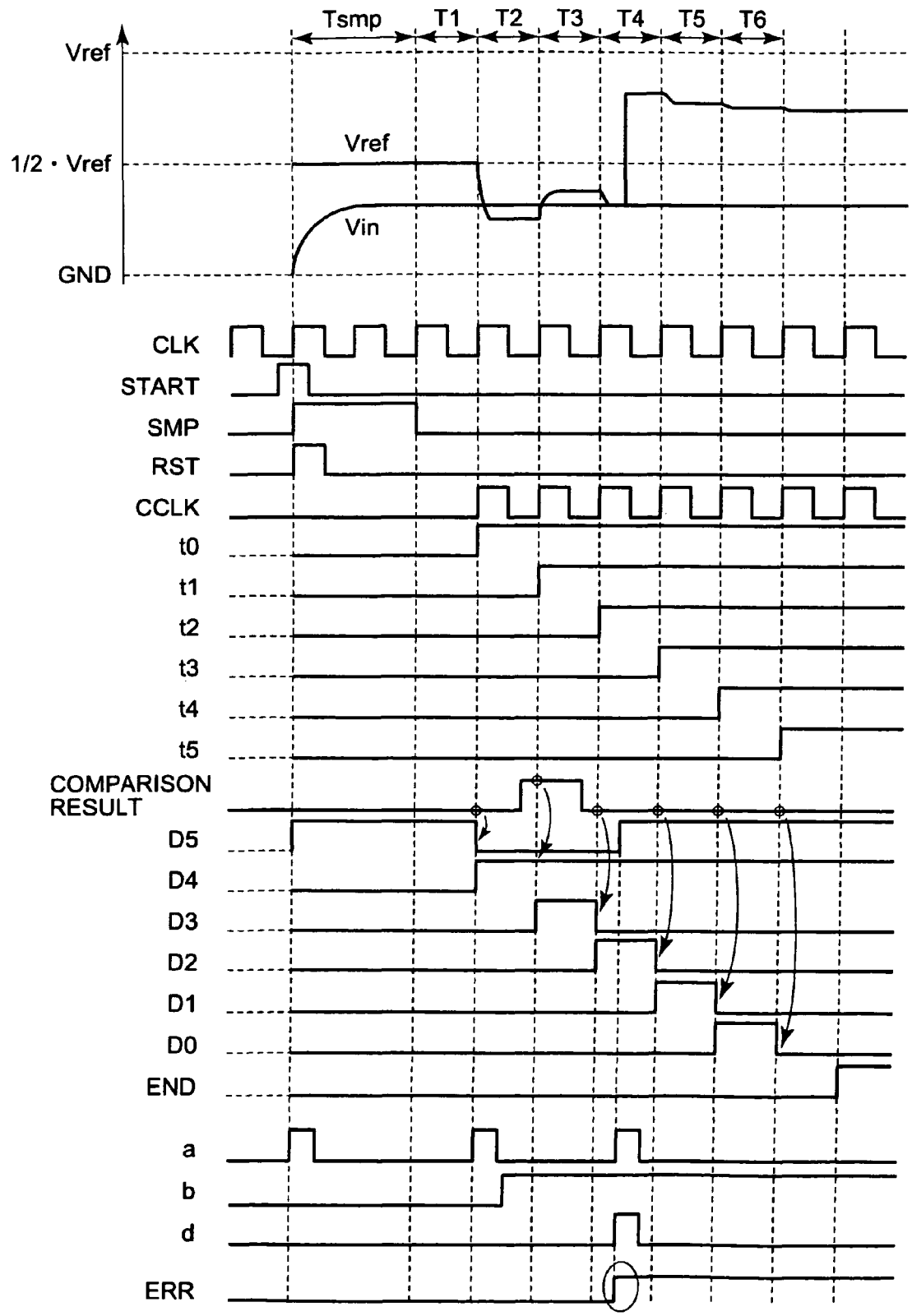
FIG. 13 is a timing diagram the respective signals in the successive approximation register and the detection circuit shown in FIG. 12.

FIG. 12 illustrates a fifth embodiment of the present invention, which is only different from the fourth embodiment in that an F/F 77 with reset is connected to the latter part of the OR circuit 76 of the detection circuit 7a. In the fourth embodiment, the detection circuit 7a outputs the pulse at the time of the abnormal change. In the fifth embodiment, as shown in FIG. 13, the abnormal conversion detection signals are continuously outputted after the point of the abnormal change until the start of the next A/D conversion. In this way, the abnormal detection signal can also be outputted as a signal other than the pulse in accordance with the specification of the circuit that receives the abnormal detection signal.

Sixth Embodiments

Figure 14:
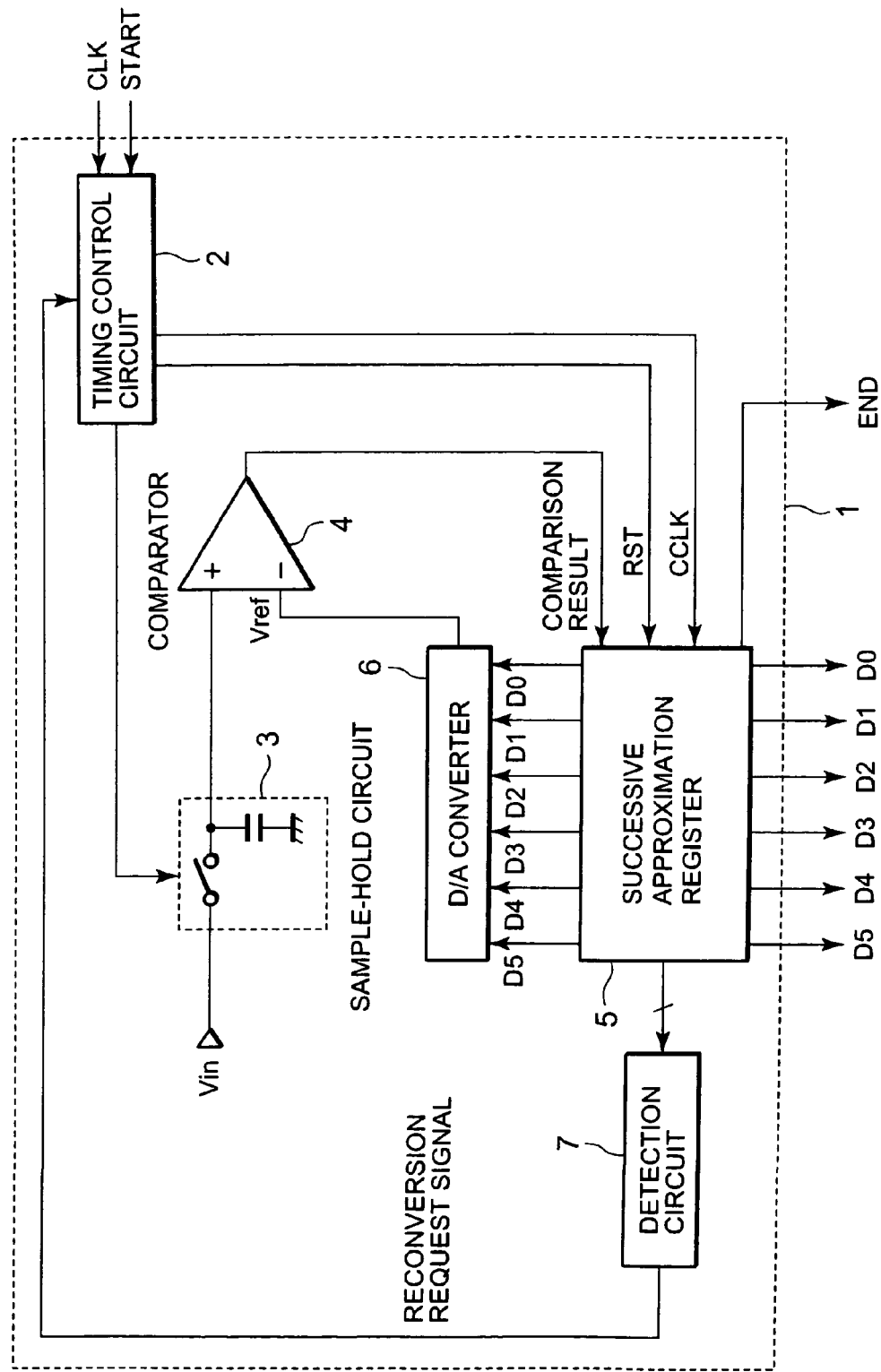
FIG. 14 is a schematic circuit diagram illustrative of the successive approximation A/D converter according a sixth embodiment of the present invention.

FIG. 14 illustrates a sixth embodiment of the present invention, which is different from the first embodiment in that the abnormal conversion detection signal ERR outputted by the detection circuit is supplied to the timing control circuit 2. The start of the conversion in accordance with the abnormal conversion detection signal ERR in the timing control circuit 2 enables to perform automatic reconversion operation when a value held by the F/F is abnormally changed. Therefore, only the A/D conversion result in which the conversion is normally completed is outputted from the A/D converter 1. As a result, the load of the processing circuitry connected externally to the A/D converter 1 can be reduced.

Although the embodiments of the present invention have been described in detail, specific configurations are not intended to be restricted to the embodiments. It should be understood that various modifications can be made without departing from the scope of the present invention.

What is claimed is:

1. An A/D converter comprising:
   a comparator that compares an analog input voltage and a reference voltage;
   a successive approximation register that stores the comparison result of the comparator and that generates comparison codes formed of a plurality of bits based on the comparison result;
   a D/A converter that generates a reference voltage for the next comparison based on the comparison codes; and
   a detection circuit that detects the change in the value of at least one bit of the comparison codes set in the successive approximation register and that outputs an abnormal conversion detection signal.

2. The A/D converter according to claim 1, wherein
   the detection circuit detects the change in the value of each bit of the comparison codes and outputs the abnormal conversion detection signal when the value of any of the bits has changed.

3. The A/D converter according to claim 1, wherein
   the detection circuit detects whether the value of the arbitrary bit is changed after the comparison result is stored in the at least one bit of the successive approximation register.

4. The A/D converter according to claim 1, further comprising
   a sample-hold circuit that samples the analog input voltage, wherein
   the first detection circuit detects whether the value of the at least one bit has changed during the period in which the sample-hold circuit samples the input voltage.

5. The A/D converter according to claim 1, wherein
   the detection circuit is the first detection circuit, and
   the A/D converter further comprises a second detection circuit that detects whether the comparison result is stored in order from higher bits to lower bits of the successive approximation register.

6. The A/D converter according to claim 1, wherein the successive approximation register responds to the abnormal conversion detection signal to initialize the successive approximation register.

7. The A/D converter according to claim 5, wherein the successive approximation register includes: a plurality of holding circuits that store the comparison result of the comparator and that output comparison codes; and a shift register that generates a storage timing signal for storing the comparison result to each of the holding circuits, and
the first detection circuit detects whether the output of the holding circuits has changed after a desired time has passed after the storage timing signal is supplied to the holding circuits.

8. The A/D converter according to claim 7, wherein in the second detection circuit, the shift register detects whether the signal is propagated in order from the holding circuits corresponding to the higher bits of the plurality of holding circuits to the holding circuits corresponding to the lower bits.

9. A successive approximation A/D converter comprising a detection circuit that detects the change after the data of at least one bit that constitutes the successive approximation register is defined as the result of the successive approximation.

10. An A/D converter comprising:
a successive approximation register; and
a comparator that compares a voltage based on data stored in the register and a sampled input voltage,
the A/D converter defining the content of each bit of the stored data of the register in accordance with the comparison output from the comparator,
the A/D converter further comprising a detection circuit that detects the change after the data of at least the highest bit of the register is defined in accordance with the output of the comparator.

11. The A/D converter according to claim 10, wherein the detection circuit detects the change in data of a plurality of bits including the highest bit of the register.

12. The A/D converter according to claim 10, wherein the detection circuit also detects the change in data of at least the highest bit during the period in which initial value data is stored in the register and in which the comparator stores the data serving as the result of comparison between the voltage based on the initial value data and the input voltage.

* * * * *